United States Patent [19]

Banyasz et al.

[11] Patent Number: 4,890,053

[45] Date of Patent: Dec. 26, 1989

[54] METHOD AND APPARATUS FOR DETECTING A MISSING OBJECT IN A SET OF OBJECTS

[75] Inventors: Joseph L. Banyasz; Aubrey T. Burton; Bernard C. LaRoy; David A. Lowitz, all of Richmond, Va.

[73] Assignee: Philip Morris Incorporated, New York, N.Y.

[21] Appl. No.: 182,171

[22] Filed: Apr. 15, 1988

[51] Int. Cl.[4] ............................................. G01R 27/04

[52] U.S. Cl. .......................... 324/58.5 A; 324/58.5 R; 324/58 A; 340/673; 340/674

[58] Field of Search ............. 340/673, 674; 324/58 R, 324/58 A, 58.5 A, 58.5 R

[56] References Cited

U.S. PATENT DOCUMENTS

| | | | |
|---|---|---|---|
| 3,339,195 | 8/1967 | Murley | 340/674 |
| 4,166,973 | 9/1979 | Lilly | 324/58.5 B |
| 4,358,731 | 11/1982 | Steinbrecher | 324/58.5 R |
| 4,381,485 | 4/1983 | Steinbrecher | 324/58 C |
| 4,603,329 | 7/1986 | Bangerter | 340/674 |
| 4,620,146 | 10/1986 | Ishikawa | 324/58.5 A |
| 4,716,360 | 12/1987 | Pakulis | 324/58.5 A |
| 4,789,820 | 12/1988 | Parrent | 324/58.5 R |

FOREIGN PATENT DOCUMENTS

| | | | |
|---|---|---|---|
| 3612749 | 10/1987 | Fed. Rep. of Germany | 324/58.5 A |

OTHER PUBLICATIONS

P. F. Goldsmith, "Quasi-Optical Techniques at Millimeter and Submillimeter Wavelengths," *Infrared and Millimeter Waves,* vol. 6, ch. 5, (K. J. Button, ed., 1982).

P. F. Goldsmith et al., "Gaussian Optics Lens Antennas," *Microwave Journal,* Jul. 1984, (Millitech Corporation reprint, Sep. 1984).

*Primary Examiner*—Reinhard J. Eisenzopf
*Assistant Examiner*—Jose M. Solis
*Attorney, Agent, or Firm*—Jeffrey H. Ingerman

[57] ABSTRACT

A millimeter wave detector for detecting missing cigarette packs or other types of objects in a set of objects is provided. The detector uses millimeter wave radiation at about 90 GHz to resolve small features of the objects being scanned. The detector can detect defects or missing packs in configurations that would not be detected by previously known detectors.

20 Claims, 9 Drawing Sheets

FIG. 4
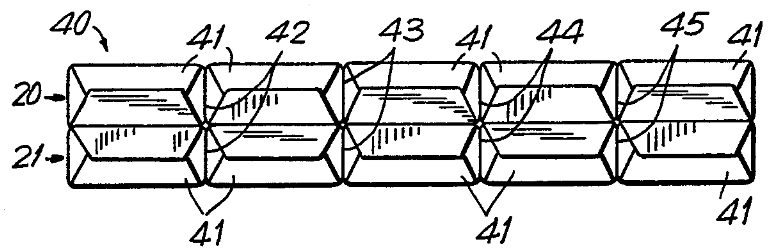
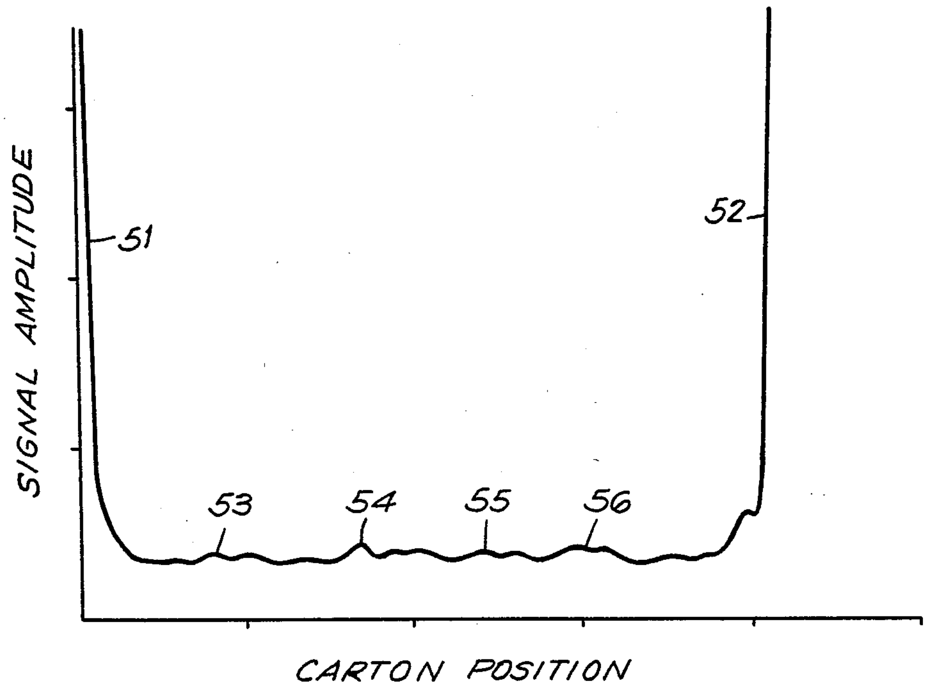
FIG. 5

FIG. 6
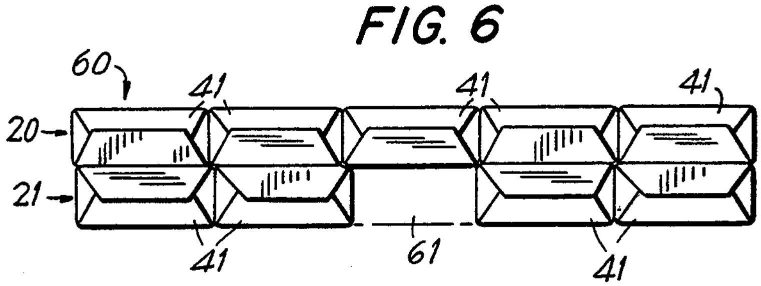
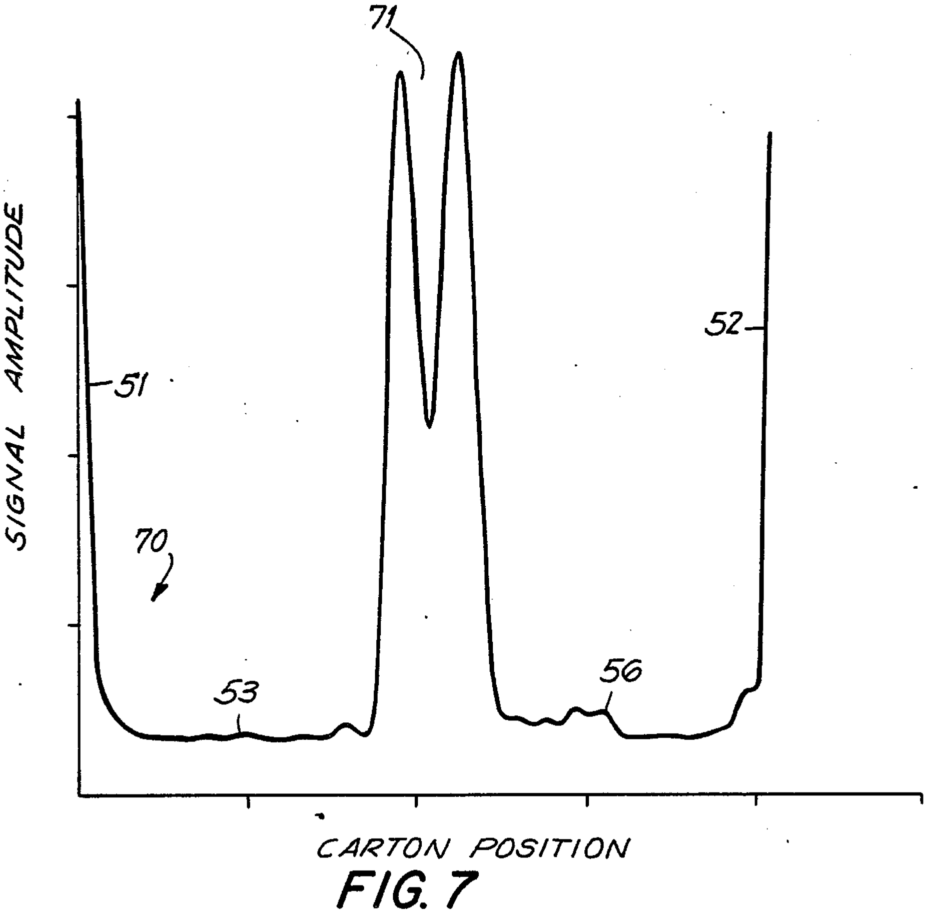
FIG. 7

FIG. 8
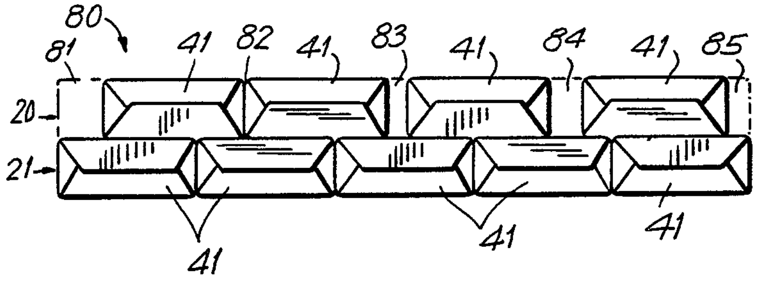
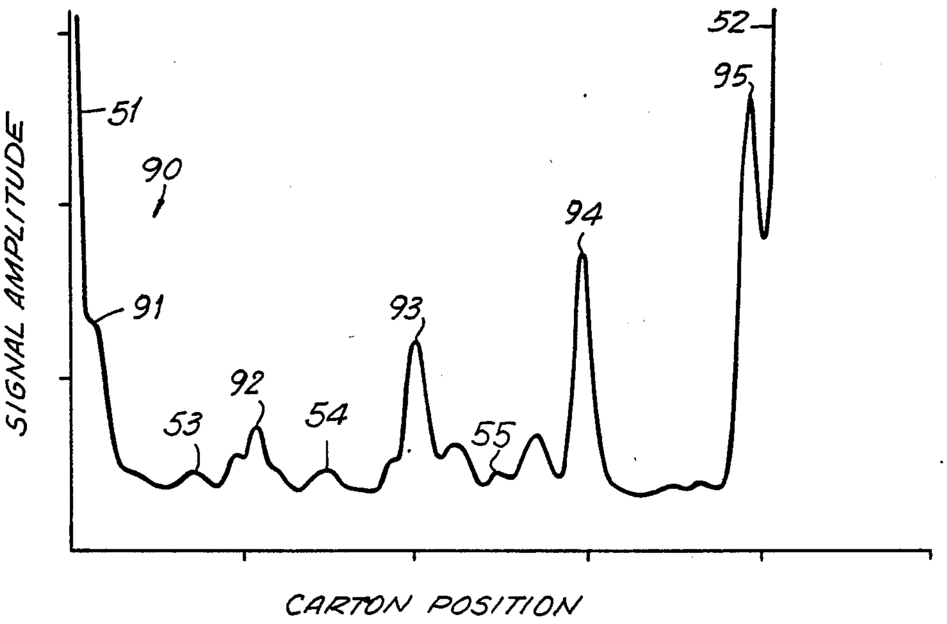
FIG. 9

FIG. 10
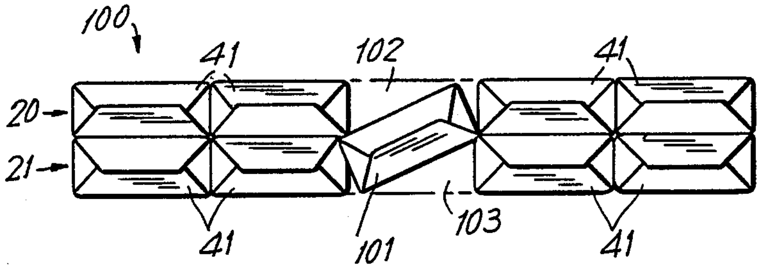
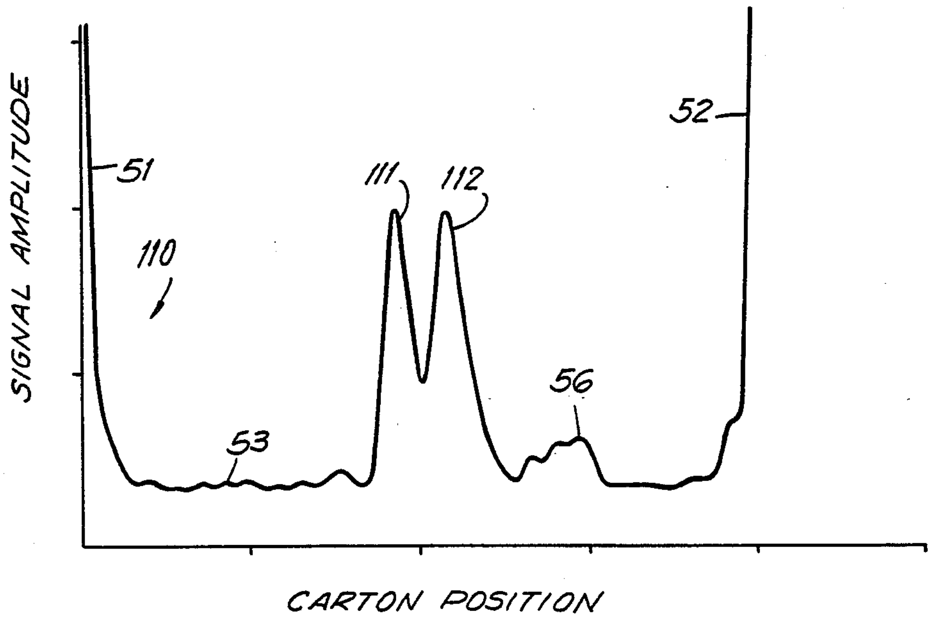
FIG. 11

METHOD AND APPARATUS FOR DETECTING A MISSING OBJECT IN A SET OF OBJECTS

BACKGROUND OF THE INVENTION

This invention relates to the use of electromagnetic radiation, particularly millimeter wave radiation, to detect a missing object in a set of objects. More particularly, this invention relates to a millimeter wave or microwave detector for detecting missing packages, such as cigarette packs, in a set of packages, such as a cigarette carton, on a packing machine assembly line.

Modern cigarette making machines are capable of producing upwards of 6,000 cigarettes per minute, wrappinq them in packs of twenty to twenty-five cigarettes, and assembling ten packs into a carton. At those rates, 240–300 packs are assembled into 24–30 cartons each minute. Occasionally, there may be instances when a pack will be omitted from a carton. This may occur, in particular, if one of the packs that is included somehow ends up in a skewed position in the carton, occupying part of the space intended for the missing pack and thereby preventing the missing pack from being included.

It is not commercially acceptable for cigarette cartons to include fewer than the designated number of packs. For this reason, it is necessary to inspect each carton on the assembly line to ensure that each contains ten packs. Known methods of detecting missing packs include beta ray devices which illuminate one side of the carton with beta radiation and examine the radiation exiting the opposite side of the carton. The radiation is partially blocked by the metallic foil or foil/paper laminate which forms part of each cigarette pack. The total amount of radiation exiting the opposite side of a correctly packed carton is known. If the amount of radiation detected is greater than the expected known amount, one can conclude that additional radiation was able to pass through the carton because of a gap where a pack is missing. However, the use of beta ray detectors requires that special care be taken in handling the radioisotopes used to generate the beta rays and invokes government regulations relating to the use of radioactive materials.

Another known type of detector for missing packs is described in commonly-assigned U.S. Pat. No. 4,166,973. That detector employs microwaves at a frequency of approximately 10 GHz, and measures the microwave energy reflected by the foil or foilpaper laminate in the pack. However, the resolution of a microwave detector in that frequency range is not sufficient to see small details associated with some pack orientations that can occur when a pack is missing. In addition, that system uses a complicated single unit for transmission of the microwave energy and for detection of the reflected energy.

Both of the types of deteCtors referred to above would miss certain defects that do not affect the total radiation passed by the carton. For example, because a cigarette pack is only slightly less than twice as tall as it is wide, if a pack is missing and a neighboring pack in the same row turns almost ninety degrees, rotating on an axis normal to its large front and back sides, so that it lies across the space intended for both it and the missing pack, there will be sufficient foil interacting with radiation in that two-pack area to prevent detection of any abnormality by the known apparatus. Smilarly, if a pack is missing, and the neighboring pack in an adjacent row rotates on an axis normal to its longer side faces, so that it lies across both its own space and the neighboring space, there will be sufficient foil interacting with radiation in that two-pack region to prevent detection of any abnormality by the known apparatus.

It would be desirable to be able to provide a missing pack detector which does not use radioisotopes.

It would also be desirable to be able to provide a missing pack detector which would be able to detect more features associated with the various orientations that can be taken by packs of cigarettes in a carton when one or more packs are missing.

It would further be desirable to provide such a detector that does not require the use of complicated specialized apparatus.

SUMMARY OF THE INVENTION

It is an object of this invention to provide a missing pack detector which does not use radioisotopes.

It is also an object of this invention to provide a missing pack detector which is able to detect more features associated with the various orientations that can be taken by packs of cigarettes in a carton when one or more packs are missing.

It is a further object of this invention to provide such a detector that does not require the use of complicated specialized apparatus.

In accordance with the present invention there is provided a method apparatus for detecting the absence, from a set of objects, of at least one object in said set, said objects being less than fully transmissive of electromagnetic radiation in a given frequency range. The method includes generating a beam of nonionizing electromagnetic radiation in the given frequency range, and shaping the beam to provide an effective shape and cross-sectional area predetermined for the set of articles. The set of articles is transported along a transport path normally to the propagation direction of the shaped beam, whereby the articles prevent transmission of at least some of the shaped beam. The radiation transmitted through the set of articles is then detected.

Apparatus for carrying out the method is also provided.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which:

FIG. 4 is an end elevational view of a group of cigarette packs as they would be arranged if properly packed within a carton (carton not shown);

FIG. 5 is a graphical representation of the millimeter wave radiation detected by the apparatus of the invention as the arrangement of packs shown in FIG. 4 passes the apparatus;

FIG. 6 is an end elevational view of a group of cigarette packs in one possible configuration from which a pack is missing;

FIG. 7 is a graphical representation of the millimeter wave radiation detected by the apparatus of the invention as the arrangement of packs shown in FIG. 6 passes the apparatus;

FIG. 8 is an end elevational view of a group of cigarette packs in another possible configuration from which a pack is missing;

FIG. 9 is a graphical representation of the millimeter wave radiation detected by the apparatus of the invention as the arrangement of packs shown in FIG. 8 passes the apparatus;

FIG. 10 is an end elevational view of a group of cigarette packs in a third possible configuration from which a pack is missing;

FIG. 11 is a graphical representation of the millimeter wave radiation detected by the apparatus of the invention as the arrangement of packs shown in FIG. 10 passes the apparatus;

DETAILED DESCRIPTION OF THE INVENTION

Figure 1:
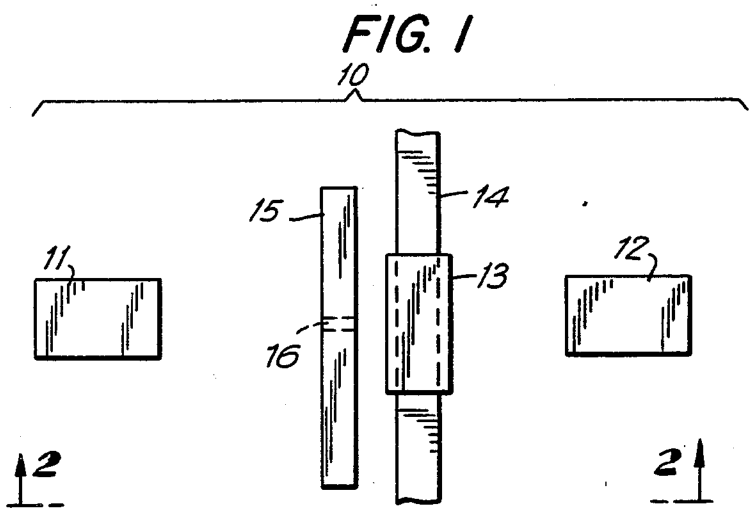
FIG. 1. is a plan view of detector apparatus according to the present invention.
Figure 2:
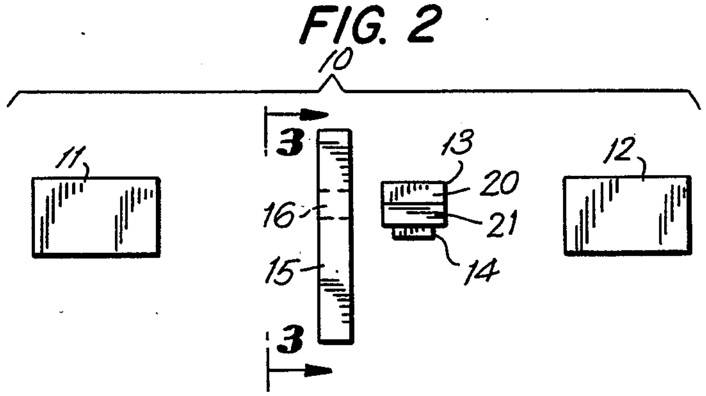
FIG. 2 is a vertical cross-sectional view of the apparatus of FIG. 1, taken from line 2—2 of FIG. 1.
Figure 3:
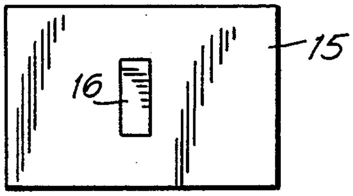
FIG. 3 is an elevational view of the absorber mask of the apparatus of FIGS. 1 and 2, taken from line 3—3 of FIG. 2.

Apparatus according to the present invention is shown schematically in FIGS. 1–3. The apparatus 10 includes a source 11 of nonionizing electromagnetic radiation and a receiver 12 positioned to receive radiation from source 11. Source 11 preferably emits millimeter wave or microwave radiation, and most preferably emits millimeter wave radiation in the 90 gigahertz frequency range. Source 11 and receiver 12 both preferably have, respectively, relatively directional transmitting and receiving horns or antennae. A particularly preferred antenna for both source 11 and receiver 12 is a ridged horn antenna with a Fresnel lens, which produces a radiation pattern having a Gaussian distribution about a line extending from the antenna.

A conveyor 14 carries cigarette carton 13, or other collections of individual objects, through the beam emitted by source 11. Interposed between source 11 and conveyor 14 is absorber 15 having beam-shaping shaping aperture 16. The purpose of absorber 15 is to prevent stray radiation that has not passed through carton 13 from reaching receiver 12. To that end, aperture 16 is of a size that allows the propagation of a limited beam portion the cross-sectional area of which is less than that of carton 13 or whatever collection of objects is being scanned. Preferably, aperture 16 is sized so that the limited beam portion propagated is only a small portion of the cross-sectional area of the collection of objects being scanned, so that at any given moment, only a small part of the total area is being scanned. More preferably, for a single line of unlayered objects, the area of aperture 16 should be less than the cross-sectional area of an individual object. In the case of cigarette carton 13, it is desirable that aperture 16 allow the propagation of a beam portion that includes at east parts of both layers 20, 21 of cigarette packs but that those parts be smaller than an individual pack, so that fine detail can be detected as described below.

Figure 1A:
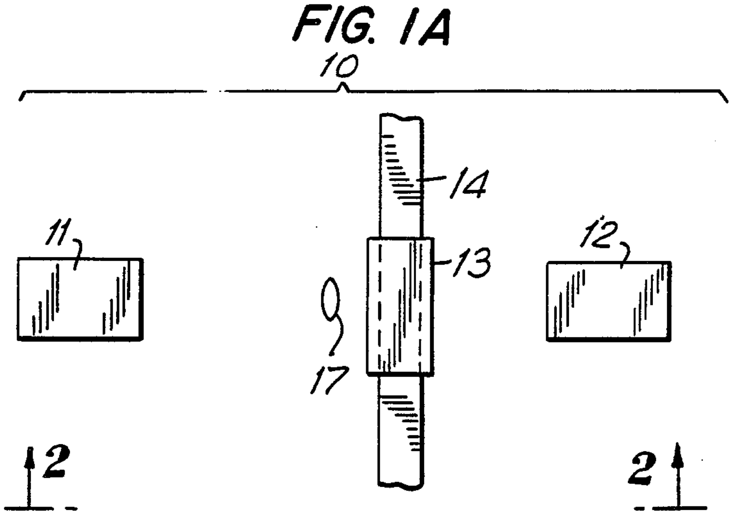
FIG 1A is a plan view of an alternative embodiment of the detector apparatus of FIG. 1.
Figure 2A:
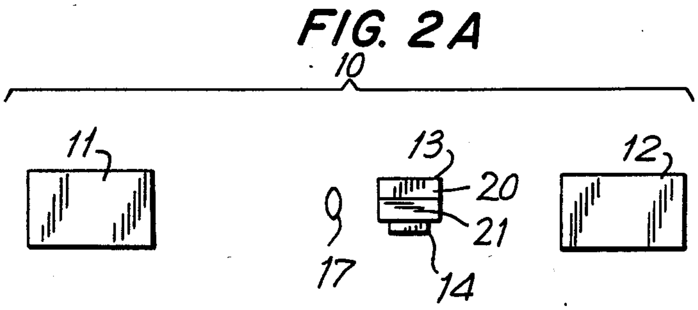
FIG. 2A is a vertical cross-sectional view of the apparatus of FIG. 1A, taken from line 2A—2A of FIG. 1A.

In general, the best shape and cross-sectional area of the beam should be predetermined empirically for the particular set of objects. Preferred dimensions for aperture 16 for shaping the beam when cigarette packs in cartons are being scanned are $1\frac{1}{4}''$ in height by $\frac{3}{8}''$ in width. Alternatively, as shown schematically in FIGS. 1A and 2A, a lens 17 could be used instead of a slit in an absorber.

If absorber 15 is used, it is preferably a foam matrix impregnated with granular carbon, although other materials that absorb electromagnetic radiation can be used. Metals or other reflective materials should be avoided, unless precautions are taken to avoid unpredictable effects on the radiation detected at receiver 12 that could be caused by reflected radiation.

If a lens is used to provide the limited beam portion, instead of absorber 15 with aperture 16, then lenses useful in the millimeter wave and microwave regions may be made from quartz (possibly coated with polyethylene to reduce reflections), the thermoplastic Rexolite ® (a trademark of Oak Laminates), or other materials of suitable index of refraction. Fresnel or continuous lens configurations may be used. The limited beam portion can also be formed by reflective focusing using wire grids or other reflective structures, or by any other techniques developed for focusing millimeter wave or microwave radiation.

Receiver 12 includes, in addition to the receiving antenna described above, some form of recording or analysis equipment, or both, to record or analyze the radiation transmitted through carton 13. In addition, an electronic circuit, such as a threshold detector, may be provided that can recognize certain patterns of received radiation as representing defects, and then activate an appropriate warning signal or alarm. In the case of cigarette cartons being conveyed past the apparatus, a device could be activated to remove the defective carton from the conveyor.

FIGS. 4–15 show various possible configurations of cigarette packs within cigarette cartons (cartons not shown) and graphical representations of the corresponding radiation patterns. The radiation patterns shown occur because the cigarette packs are for some reason less than fully transmissive of electromagnetic radiation. For example, most cigarette packs include a layer of metallic foil or of a metallic foil/paper laminate which reflects electromagnetic radiation.

FIG. 4 shows the standard arrangement 40 of cigarette packs 41 in a cigarette carton—namely, two rows 20, 21 of five packs 41 each. FIG. 5 shows the radiation pattern that would be produced by standard arrangement 40. As seen in FIG. 5, signal 50 falls off rapidly at 51 as the beginning of carton 13 containing pack configuration 40 passes between the aperture 16 and receiver 12. Signal 50 rises again to its maximum level at 52 as the end of carton 13 passes out of the field of apparatus 10. In the region between 51 and 52, signal 50 is substantially constant at a low level, as there is substantially no area in configuration 40 in which the radiation-blocking foil is not present. However, at 90 gigahertz, the frequency at which the preferred embodiment operates, there is sufficient resolution to produce slight peaks 53–56 representing the planes of abutment 42–45 between adjacent packs 41. The significance of being able to detect the planes of abutment will become apparent below.

FIG. 6 shows a configuration 60 from which a single pack is missing at 61, but in which all other packs 41 remain in their expected locations. As seen in FIG. 7, there is thus a large area in which there is no foil to block the millimeter wave radiation, resulting in large double peak 71 in signal 70.

FIG. 8 shows a configuration 80 from which a single pack is missing from row 20, and the other packs 41 in row 20 have shifted laterally, leaving gaps 81–85 in row 20. As seen in FIG. 9, gaps 81–85 result in several smaller peaks 91–95 in signal 90.

In configuration 100 of FIG. 10, a single pack is missing from one of rows 20, 21, and an adjacent pack 101 from the other row has rotated about its longest axis so that it is partially in each row, leaving two major gaps 102, 103. As seen in FIG. 11, gaps 102, 103 give rise to peaks 111, 112 in signal 110.

Figure 12:
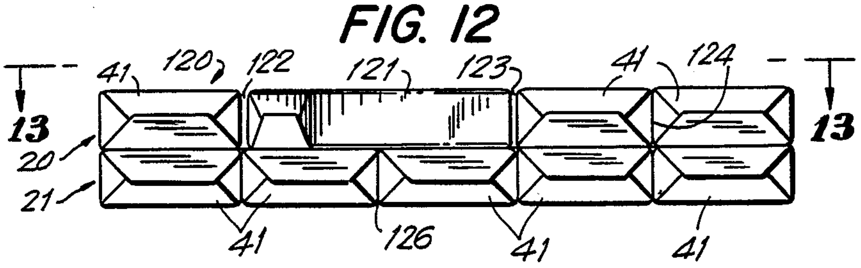
FIG. 12 is an end elevational view of a group of cigarette packs in a fourth possible configuration from which a pack is missing.
Figure 13:
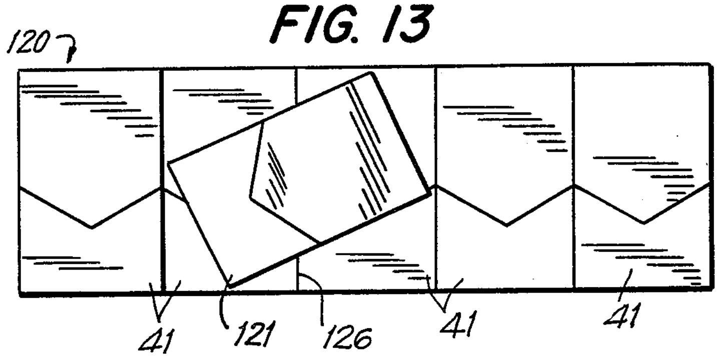
FIG. 13 is a plan view of the configuration of packs shown in FIG. 12.
Figure 14:
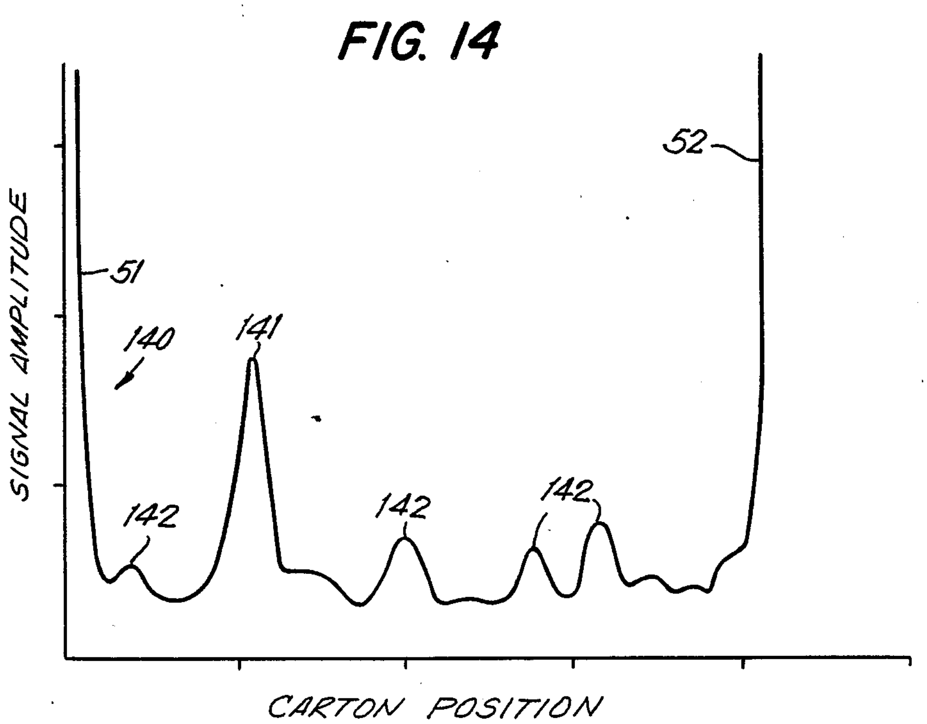
FIG. 14 is a graphical representation of the millimeter wave radiation detected by the apparatus of the invention as the arrangement of packs shown in FIGS. 12 and 13 passes the apparatus.

FIGS. 12 and 13 show a configuration 120 in which a single pack is missing and an adjacent pack 121 in the same row has rotated about an axis normal to its front and back faces, lying across the space intended to be occupied by both it and the missing pack. This results in poor abutments at 122, 123 in the configuration, as well as general weakening of abutment 124. Poor abutments 122, 123 produce the signal 140 shown in FIG. 14, with large peak 141. The weakening of other abutments, such as at 124, also increases the magnitude of the "normal" peaks 142. If a threshold detector is used, it may simply detect the much larger peak 141. One can also use a more sohpisticated detector to compare the relative magnitudes of peak 141 and peaks 142, or to detect the total pattern of curve 140. For example, by lowering the threshold, both peaks 141, 142 can be detected. The difference or ratio of the peaks can then be determined, or one might use phased counting, phasing in one carton at a time and counting the number of peaks.

Figure 15:
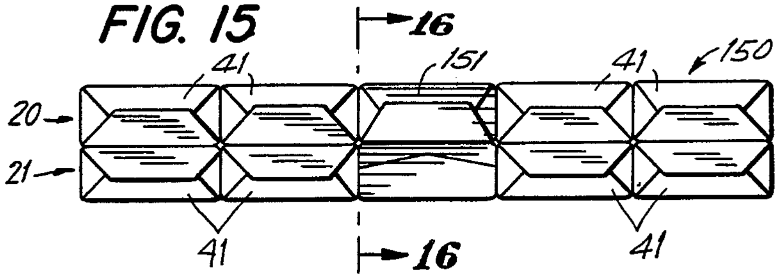
FIG. 15 is an end elevational view of a group of cigarette packs in a fifth possible configuration from which a pack is missing.
Figure 16:
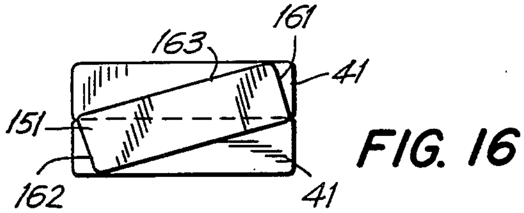
FIG. 16 is a vertical cross-sectional view of the configuration shown in FIG. 15, taken from line 16—16 of FIG. 15.

FIGS. 15 and 16 show a configuration 150 the abnormality of which would not be detected by apparatus 10 of FIGS. 1 and 2. In configuration 150, a single pack is missing from one of rows 20, 21 and adjacent pack 151 from the other row has rotated about an axis normal to its long side faces so that it occupies space in both rows 20, 21, leaving no gaps in the foil barrier presented to the millimeter wave radiation.

Figure 17:
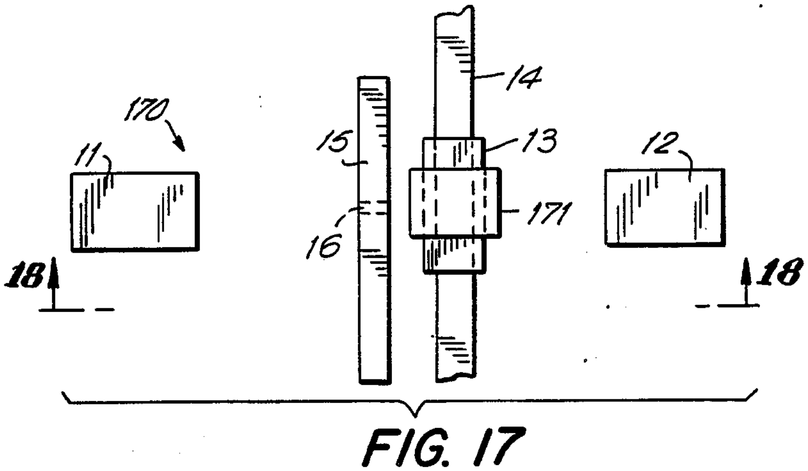
FIG. 17 is a plan view of a preferred embodiment of the apparatus of the invention.
Figure 18:
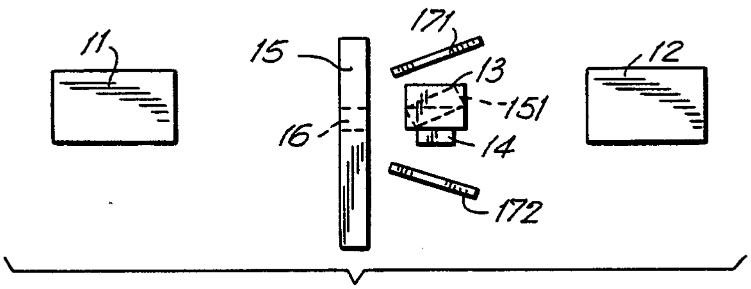
FIG. 18 is a vertical cross-sectional view of the apparatus of FIG. 17, taken from line 18—18 of FIG. 17.
Figure 19:
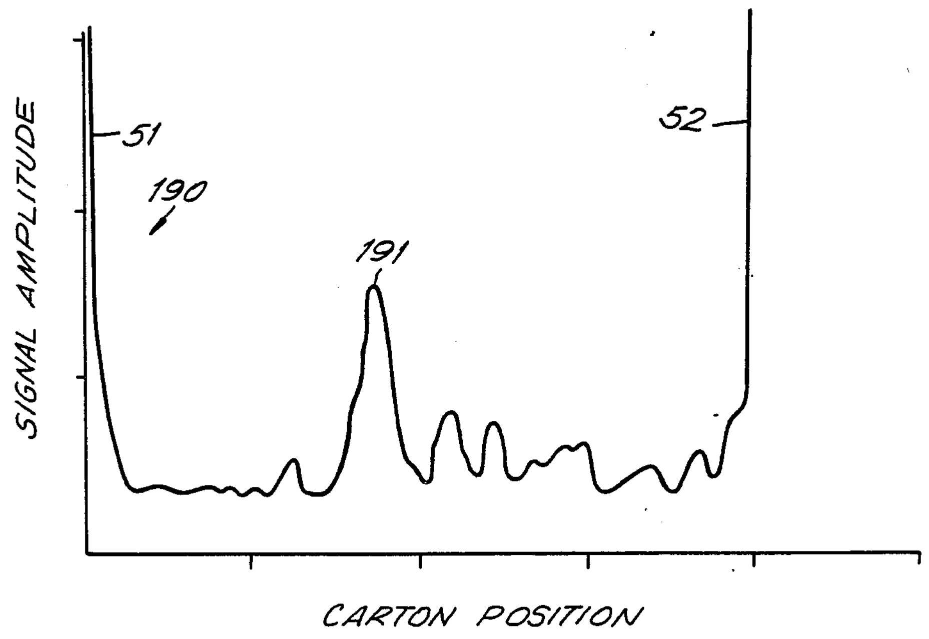
FIG. 19 is a graphical representation of the millimeter wave radiation detected by the apparatus of FIGS. 17 and 18 as the arrangement of packs shown in FIGS. 15 and 16 passes the apparatus.

However, the abnormality of configuration 150 can be detected by modified apparatus 170 shown in FIGS. 17 and 18 which relies on the fact that radiation impinging on side 163 is reflected upwards by the foil in side 163. Apparatus 170 is therefore a more preferred embodiment of the invention than apparatus 10. Apparatus 170 is identical to apparatus 10, except that apparatus 170 includes reflector plate 171 mounted above the sampling area inclined at an angle empirically determined for the particular conveyor system, the articles being monitored and the positions of the transmitting and receiving antennae. If the material from which the conveyor system is fabricated does not interact strongly with electromagnetic radiation in the frequency range of interest, a similar plate 172 can be used below the conveyor. As depicted in FIGS. 17 and 18, angled plate 171 and, if used, angled plate 172, guide radiation reflected from pack 151 past carton 13 to the receiving antenna. Depending on which way pack 151 is tilted—i.e., end 162 down and end 161 up, or end 162 up and end 161 down, respectively, then either plate 171 or plate 172 will interact with the radiation reflected from side 163 of pack 151 and reflect it further to receiver 12, giving rise to peak 191 in signal 190.

Apparatus 10 or 170 can, as discussed above, be equipped with an electronic warning device that will sound an alarm when a defective carton is found. This might be done by providing a threshhold detector which produces an output whenever the signal level rises above a predetermined value when a carton is present. The output could cause the sounding of an alarm, activate a reject device, or both. Of course, other means for causing the apparatus to act when a defect is found can be used.

Thus is seen that a detector for missing packs and other objects has been provided which does not rely on radioactive substances, does not use specialized equipment, and can detect features smaller than any of the individual objects being scanned. One skilled in the art will appreciate that the present invention can be practiced by other than the described embodiments, which are presented for purposes of illustration and not of limitation, and the present invention is limited only by the claims which follow.

What is claimed is:

1. A method for detecting the absence, from a set of objects, of at least one object in said set, said objects being less than fully transmissive of electromagnetic radiation in a given frequency range outside the optical frequency range and being at least partially reflective in said given frequency range, said objects being enclosed in a container that is substantially opaque in the optical frequency range but is at least partially transmissive in said given frequency range, said method comprising the steps of:

generating a monochromatic beam of electromagnetic radiation in said given frequency range, said beam propagating in a propagation direction;

shaping said beam to provide an effective shape and cross-sectional area predetermined for said set of objects;

transporting said set of articles along a transport path normal to said propagation direction of said shaped beam, whereby said objects prevent transmission of at least some of said shaped beam; and detecting radiation transmitted through said set of objects.

2. The method of claim 1 wherein said shaping step comprises passing said beam through an appropriate lens.

3. The method of claim 1 wherein said shaping step comprises absorbing a first portion of said beam and allowing transmission of a limited portion of said beam.

4. The method of claim 1 further comprising analyzing said detected radiation.

5. The method of claim 1 wherein said generating step comprises generating a beam of electromagnetic radiation in the millimeter wave frequency range.

6. The method of claim 5 wherein said generating step comprises generating a beam of electromagnetic radiation at a frequency of about 90 gigahertz.

7. The method of claim 1 wherein said generating step comprises generating a beam of electromagnetic radiation in the microwave frequency range.

8. The method of claim 1 further comprising detecting at least some of the radiation reflected by said objects.

9. Apparatus for detecting the absence, from a set of objects, of at least one object in said set, said objects being less than fully transmissive of electromagnetic radiation in a given frequency range outside the optical frequency range and being at least partially reflective in said given frequency range, said objects being enclosed in a container that is substantially opaque in the optical frequency range but is at least partially transmissive in said given frequency range, said apparatus comprising:

means for generating a monochromatic beam of electromagnetic radiation in said given frequency range, said beam propagating in a propagating direction;

means for shaping said beam to provide an effective shape and cross-sectional area predetermined for said set of objects;

means for transporting said set of articles along a transport path normal to said propagation direction of said shaped beam, whereby said objects prevent transmission of at least some of said shaped beam; and means for detecting radiation transmitted through said set of objects.

10. The apparatus of claim 9 wherein said shaping means comprises an appropriate lens.

11. The apparatus of claim 9 wherein said shaping means comprises means for absorbing a first portion of said beam and allowing transmission of a limited portion of said beam.

12. The apparatus of claim 9 further comprising means for analyzing said detected radiation.

13. The apparatus of claim 9 wherein said generating means generates a beam of electromagnetic radiation of the millimeter wave frequency range.

14. The apparatus of claim 13 wherein said generating means generates a beam of electromagnetic radiation at a frequency of about 90 gigahertz.

15. The apparatus of claim 9 wherein said generating means generates a beam of electromagnetic radiation in the microwave frequency range.

16. The apparatus of claim 9 further comprising means for directing toward said detecting means at least some of the radiation reflected by said objects for detecting said reflected radiation.

17. The apparatus of claim 16 wherein said generating means, said transport path and said detecting means are in a plane and said directing means s for directing toward said detecting means radiation reflected out of said plane.

18. The apparatus of claim 16 wherein said directing means comprises at least one reflector of electromagnetic radiation.

19. The apparatus of claim 9 wherein said generating means, said transport path and said detecting means are in a plane.

20. The apparatus of claim 19 wherein said detecting means is in line with said generating means in said propagation direction.

* * * * *

UNITED STATES PATENT AND TRADEMARK OFFICE
CERTIFICATE OF CORRECTION

PATENT NO. : 4,890,053

DATED : December 26, 1989

INVENTOR(S) : Joseph L. Banyasz et al.

It is certified that error appears in the above-identified patent and that said Letters Patent is hereby corrected as shown below:

Column 1, line 57, "deteCtors" should be -- detectors --;

line 67, "Smilarly" should be -- Similarly --.

Claim 13, column 8, line 10, "of" (second occurrence) should be -- in --.

Claim 17, column 8, line 24, "means s" should be -- means is --.

Signed and Sealed this

Third Day of September, 1991

Attest:

HARRY F. MANBECK, JR.

*Attesting Officer* *Commissioner of Patents and Trademarks*